United States Patent
Hino et al.

(10) Patent No.: US 9,881,813 B2
(45) Date of Patent: Jan. 30, 2018

(54) MOUNTING STRUCTURE AND METHOD FOR PRODUCING MOUNTING STRUCTURE

(71) Applicant: Panasonic Intellectual Property Management Co., Ltd., Osaka (JP)

(72) Inventors: Hirohisa Hino, Osaka (JP); Yasuhiro Suzuki, Osaka (JP); Masato Mori, Hyogo (JP); Naomichi Ohashi, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/212,158

(22) Filed: Jul. 15, 2016

(65) Prior Publication Data
US 2017/0040184 A1 Feb. 9, 2017

(30) Foreign Application Priority Data
Aug. 4, 2015 (JP) .................. 2015-153758

(51) Int. Cl.
*H01L 21/48* (2006.01)
*H01L 23/498* (2006.01)
(Continued)

(52) U.S. Cl.
CPC .... *H01L 21/4853* (2013.01); *H01L 23/49816* (2013.01); *H01L 24/16* (2013.01); *H01L 24/81* (2013.01); *H01L 25/0657* (2013.01); *H01L 25/105* (2013.01); *H01L 25/50* (2013.01); *H01L 2021/60007* (2013.01); *H01L 2225/06517* (2013.01); *H01L 2225/06572* (2013.01); *H01L 2225/107* (2013.01); *H01L 2225/1023* (2013.01); *H01L 2225/1058* (2013.01); *H01L 2924/15311* (2013.01)

(58) Field of Classification Search
CPC ..... H01L 21/4853; H01L 24/16; H01L 25/50; H01L 25/105; H01L 24/81; H01L 23/49816; H01L 25/0657; H01L 2924/15311; H01L 2225/1023; H01L 2225/1058; H01L 2225/107; H01L 2225/06517; H01L 2225/06572
USPC ........................................................ 257/737
See application file for complete search history.

(56) References Cited

U.S. PATENT DOCUMENTS 6,115,913 A * 9/2000 Yamasaki .......... H01R 43/0235
                                                     29/830
6,617,695 B1 * 9/2003 Kasatani ........... H01L 23/49816
                                                    257/686

(Continued)

FOREIGN PATENT DOCUMENTS

JP          52042418          6/2013

*Primary Examiner* — Marc Armand
*Assistant Examiner* — Sue Tang
(74) *Attorney, Agent, or Firm* — Panasonic IP Management; Kerry S. Culpepper

(57) ABSTRACT

A mounting structure, including: a first component that has a first bump; a second component that has a second bump; a mounting component that has a primary mounting surface and a secondary mounting surface; a first solder that connects an electrode on the primary mounting surface and the first bump; a second solder that connects an electrode on the secondary mounting surface and the second bump; and a reinforcing resin that covers a part of the first solder and that is not in contact with the primary mounting surface.

6 Claims, 7 Drawing Sheets

(51) Int. Cl.
*H01L 25/065* (2006.01)
*H01L 23/00* (2006.01)
*H01L 25/10* (2006.01)
*H01L 25/00* (2006.01)
*H01L 21/60* (2006.01)

(56) References Cited

U.S. PATENT DOCUMENTS

| | | | |
|---|---|---|---|
| 2002/0033525 A1* | 3/2002 | Ohuchi | H01L 21/563 257/679 |
| 2002/0098609 A1* | 7/2002 | Ono | G02B 6/4212 438/31 |
| 2006/0043597 A1* | 3/2006 | Wada | B23K 35/025 257/772 |
| 2011/0095423 A1 | 4/2011 | Ohashi et al. | |

* cited by examiner

MOUNTING STRUCTURE AND METHOD FOR PRODUCING MOUNTING STRUCTURE

TECHNICAL FIELD

The technical field relates to a mounting structure that includes a mounting component, and components (e.g. semiconductor chips or semiconductor packages having solder bumps, and electronic components having solder bumps) that are mounted on both surfaces of the mounting component.

BACKGROUND

In recent years, miniaturization and high functionalization of mobile devices such as portable phones and PDAs (Personal Digital Assistants) have progressed. For mounting technologies that can cope with such trends, mounting structures such as BGAs (Ball Grid Arrays) and CSPs (Chip Scale Packages) are frequently used. Mobile devices are likely to be exposed to mechanical load such as drop impact. QFPs (Quad Flat Packages) absorb shocks on its lead part. However, in BGAs and CSPs, which have no lead parts for cushioning shocks, it has been increasingly important to secure reliability in the impact resistance.

The melting point of Pb eutectic solder, which is conventional typical solder, is 183° C. However, with regard to the melting point of recent lead-free solder, the melting point of typical Ag—Sn—Cu solder is about 30° C. higher than the PB eutectic solder. The maximum temperature in the profile of the reflow furnace is increased to 220° C. to 260° C.

Therefore, in cases where components with insufficient high-temperature resistance are mounted on wiring substrates, only such components are joined to the substances by spot soldering in a separate step. Consequently, the productivity is significantly low.

For that reason, low-melting-temperature Pb-free solder, such as Sn—Zn solder, Sn—Ag—In solder, and Sn—Bi solder, which is free of the demerit of the high melting point of the Sn—Ag—Cu solder, has been started to be used. However, with regard to the BGA connection using the Sn—Zn, Sn—Ag—In or Sn—Bi solder, connection reliability in the soldered connection parts is still unclear.

As a countermeasure, a production method in which a solder paste using a thermosetting resin as a flux has been proposed in order to enhance reliability in the impact resistance in connection parts (Japanese Patent No. 5,204,241, Publication)

In this method, the resin in the solder paste is separated from the solder when soldering is conducted, and the resin covers the periphery of the solder. Thus, the strength of the solder is reinforced by the resin.

SUMMARY

FIGS. 1A to 1D show steps for mounting components onto both surfaces of a circuit substrate.

In FIG. 1A, a semiconductor device 1 is mounted on a solder paste P that has been coated onto a primary mounting surface 101 of the circuit substrate 8. The solder paste P has a composition in which solder with a low setting temperature and a thermosetting resin are mixed. The circuit substrate 8 on which the semiconductor device 1 is mounted is heated by a heating furnace 16, as shown in FIG. 1B. Consequently, the semiconductor device 1 and the circuit substrate 8 are joined through a metal. The correspond to the first connection step. Next, in FIG. 1C, the circuit substrate 8 is inverted upside down, the solder paste P is coated onto a secondary mounting surface 102 of the circuit substrate 8, and a semiconductor device 9 is mounted thereon. In FIG. 1D, the resulting material is subjected to reflow heating in the heating furnace 16 to cause a solder ingredient in the solder paste P to malt. Consequently, the semiconductor device 9 and the circuit substrate 8 are joined through a metal. These correspond to the second connection step. In this manner, a mounting structure in which the semiconductor devices 1 and 9 are respectively mounted on both of the surfaces of the circuit substrate 8 is prepared.

FIG. 2A shows an enlarged cross-section view of the connection parts between the circuit substrate 8 and the semiconductor devices 1 and 9.

An electrode 3 of the semiconductor device 1, and an electrode 7a on the primary mounting surface 101 are electrically connected with each other through a bump 4 and a solder part 5, which has been separated from the solder paste P. An electrode 11 of the semiconductor device 9, and an electrode 7b of the secondary mounting surface 102 are electrically connected with each other through a bump 12 and a solder part 13, which had been separated from the solder pate P. Furthermore, a reinforcing resin 6, which corresponds to a resin ingredient that has been separated from the solder paste P and which has been cured, covers the entire surface of the solder part 5 between the primary mounting surface 101 of the circuit substrate 8 and a substrate 2 of the semiconductor device 1, Also, a reinforcing resin 14, which correspond to a resin ingredient that has been separated from the solder paste P and which has been cured, covers the entire surface of the solder part 13 between the secondary mounting surface 102 of the circuit substrate 8 and a substrate 10 of the semiconductor device 9.

With regard to the above structure, the first heat treatment, in which the semiconductor device 1 is soldered onto the primary mounting surface of the circuit substrate 8, is carried out, and then, the second heat treatment, in which the semiconductor device 9 is soldered onto the secondary mounting surface of the circuit substrate 8, is carried out.

In the second heat treatment, the solder part 5, which has already completed the connection in the first mounting step, is again melted. In the case, sine the periphery of the solder part 5 is covered with the reinforcing resin 6, solder flush sometimes occurs. As shown in FIG. 2B, the solder flush is a phenomenon in which a void 18 is generated inside the solder part 5, which has been again melted when the second heat treatment was carried out, and solder 19, which is a part of the molten solder part 5, flows out of a gap that has been formed through breakage of the connection part between the circuit substrate 8 and the reinforcing resin 6.

When such solder flush occurs, a short circuit may occur in the circuit due to the presence of the protruding solder 19, and this can cause a failure in the operation of the mounting structure. Therefore, any countermeasures that prevent solder flush from occurring in mounting structures have been sought out.

In this case, if the gap between the melting points of the solder part 5 and the solder part 13 is enlarged, the above-mentioned problem can be solved without causing the solder part 5, which has been formed in the first heat treatment, to melt in the heat treatment in the second mounting step. However, the gap in the melting points cannot be enlarged since lead-free solder materials with low melting temperatures are limited. Furthermore, if different solder pastes are used, then, the soldering process will be complex, and therefore, such use of different solder pastes is unfavorable.

In addition, an option in which the first heat treatment is carried out merely for temporal fixing (only for temporal fixing at a melting point or lower), and the solder parts on both of the upper and lower sides are caused to melt in the second heat treatment can be considered. However, such temporal fixing would cause the intermediate state to be unstable, would make the process complex, and would cause the self-alignment not to work if the entire body of the solder part 5 is caused to melt on the lower surface of the circuit substrate 8. Therefore, such a process including temporal fixing is unfavorable.

One purpose of the disclosure is to provide a mounting structure that includes a mounting component, and components mounted on both surfaces of the mounting component, and that does not have any defects caused from occurrence of solder flush, which is likely to occur in conventional methods for producing mounting structures. Furthermore, another purpose of the disclosure is to provide a method for producing a mounting structure, in which solder flush hardly occurs even in cases where components are mounted on both surfaces of a mounting component such as a circuit substrate.

According to one aspect of the disclosure, provided is a mounting structure, including; a first component that has a first bump; a second component that has a second bump; a mounting component that has a primary mounting surface and a secondary mounting surface; a first solder that connects an electrode on the primary mounting surface and the first bump; a second solder that connects an electrode on the secondary mounting surface and the second bump; and a reinforcing resin that covers a part of the first solder and that is not in contact with the primary mounting surface.

Moreover, according to another aspect of the disclosure, provided is a mounting structure, including: a first component that has a first bump; a second component that has a second bump; a mounting component that has a primary mounting surface, on which the first component is mounted, and a secondary mounting surface, on which the second component is mounted; a first solder that is located between an electrode on the primary mounting surface of the mounting component and the first bump; a second solder that is located between an electrode on the secondary mounting surface of the mounting component and the second bump; a second reinforcing resin that covers entire lateral surfaces of the second bump and the second solder; and a first reinforcing resin, wherein the base end of the first reinforcing resin is connected to the primary mounting surface of the mounting component, and the top end of the first reinforcing resin is not in contact with the first bump, wherein a portion of the first solder is exposed as an exposed part that is formed between the top of the first reinforcing resin and a substrate of the first component.

Furthermore, according to yet another aspect of the disclosure, provided is a mounting structure, including: a first component that has a first bump; a second component that has a second bump; a mounting component that has a primary mounting surface, on which the first component is mounted, and a secondary mounting surface, on which the second component is mounted; a first solder that is located between an electrode on the primary mounting surface of the mounting component and the first bump; a second solder that is located between an electrode on the secondary mounting surface of the mounting component and the second bump; a second reinforcing resin wherein the base end of the second reinforcing resin is connected to the secondary mounting surface of the mounting component, and the top end of the second reinforcing resin is not in contact with the second bump; and a first reinforcing resin wherein the base end of the first reinforcing resin is connected to the primary mounting surface of the mounting component, and the top end of the first reinforcing resin is not in contact with the first bump, wherein a portion of the first solder is exposed as an exposed part that is formed between the top of the first reinforcing resin and a substrate of the first component, and a portion of the second solder is exposed as an exposed part that is formed between the top of the second reinforcing resin and a substrate of the second component.

In addition, according to yet another aspect of the disclosure, provided is a method for producing a mounting structure, including: (i) connecting a first bump provided on a first component to an electrode on a primary mounting surface of a mounting component through a first solder by subjecting a first solder paste to a primary reflow treatment; and (ii) connecting a second bump provided on a second component to an electrode on a secondary mounting surface of the mounting component through a second solder by subjecting a second solder paste to a secondary reflow treatment, wherein, the first solder paste includes a solder ingredient and a thermosetting resin ingredient, and, in Step (i), the first solder paste is separated into the fist solder and the thermosetting resin ingredient through the primary reflow treatment, the base end of the thermosetting resin ingredient comes into contact with the mounting component, the thermosetting resin ingredient covers a portion of the first solder, and the top end of the thermosetting resin ingredient does not come into contact with the first bump.

According to the disclosure, a structure in which the reinforcing resin, which covers a portion of the first solder that joins the first component to the electrode on the primary mounting surface of the mounting component, is not in contact with the first bumps and in which the entire periphery of the first solder is not covered with the resin, is formed in the production process. As a result, in a case where the first solder is caused to reflow to mount the second component on the secondary mounting surface of the mounting component, solder flush does not occur in the production process since the first solder, which has been again melted through the reflow treatment, spreads outward from the exposed part, and then, moves back to the original position when it is subsequently cooled. Furthermore, since any solder flush does not occur, the mounting structure according to the disclosure does not have any defects caused from solder flush.

DESCRIPTION OF EMBODIMENTS (First Embodiment)

Figure 1A:
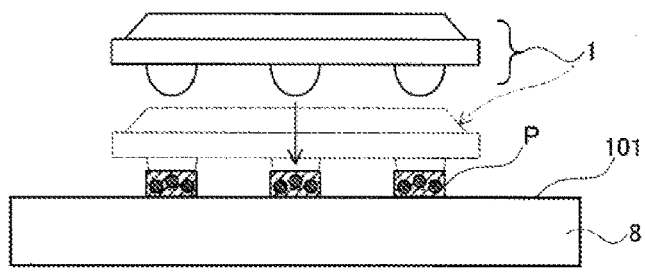
FIGS. 1A to 1D are diagrams that show steps of a related art soldering method.
Figure 1B:
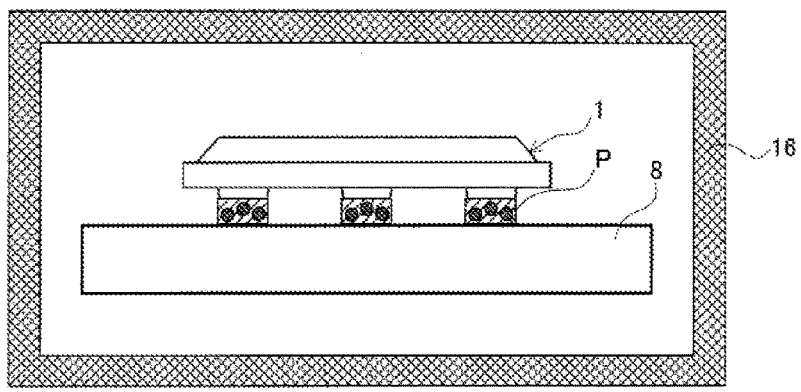
Figure 1C:
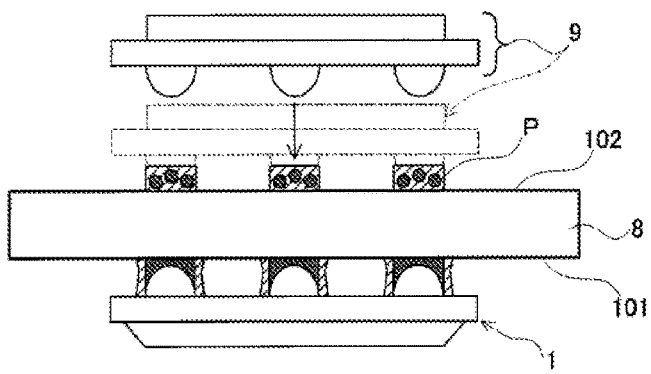
Figure 1D:
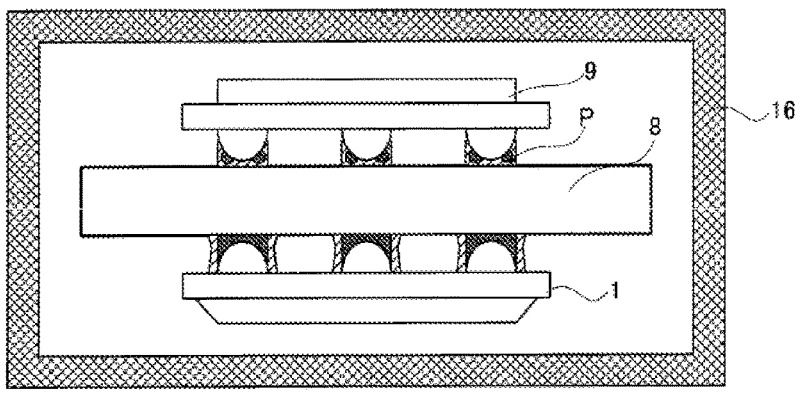
Figure 2A:
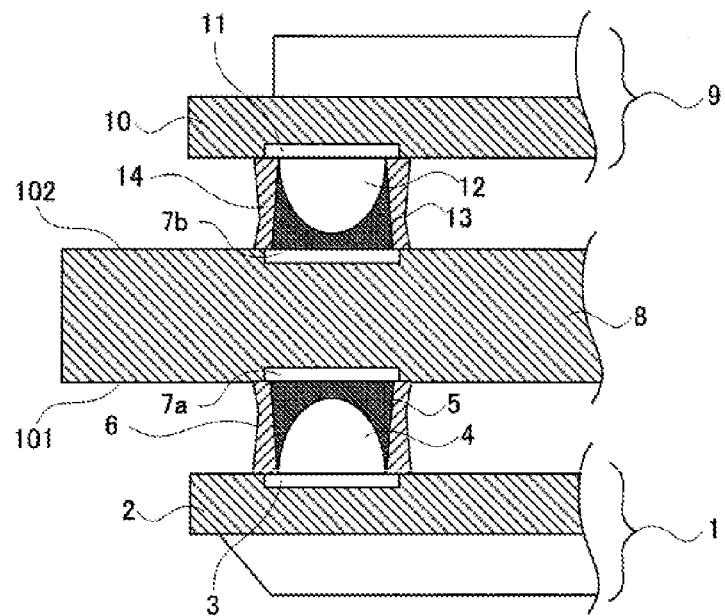
FIG. 2A is an enlarged cross-sectional view of connection parts in a related art soldering method.
Figure 2B:
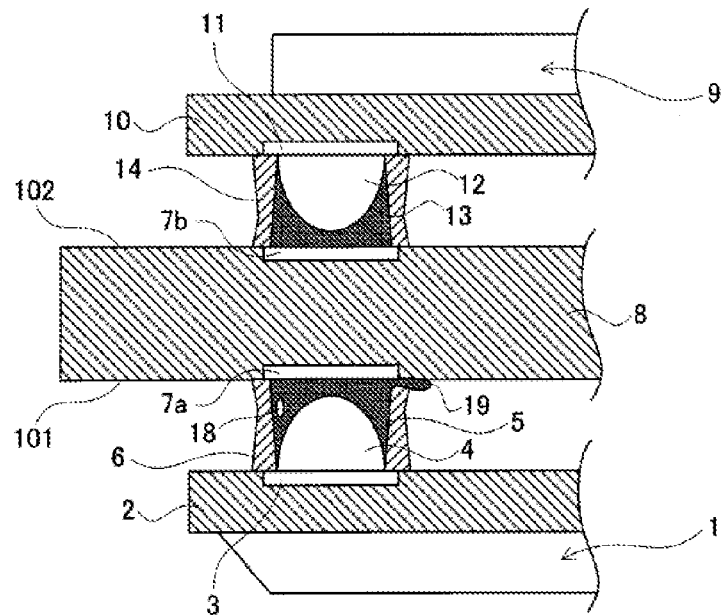
FIG. 2B is an enlarged cross-sectional view of connection parts in a case where solder flush occurs in a related art soldering method.
Figure 3:
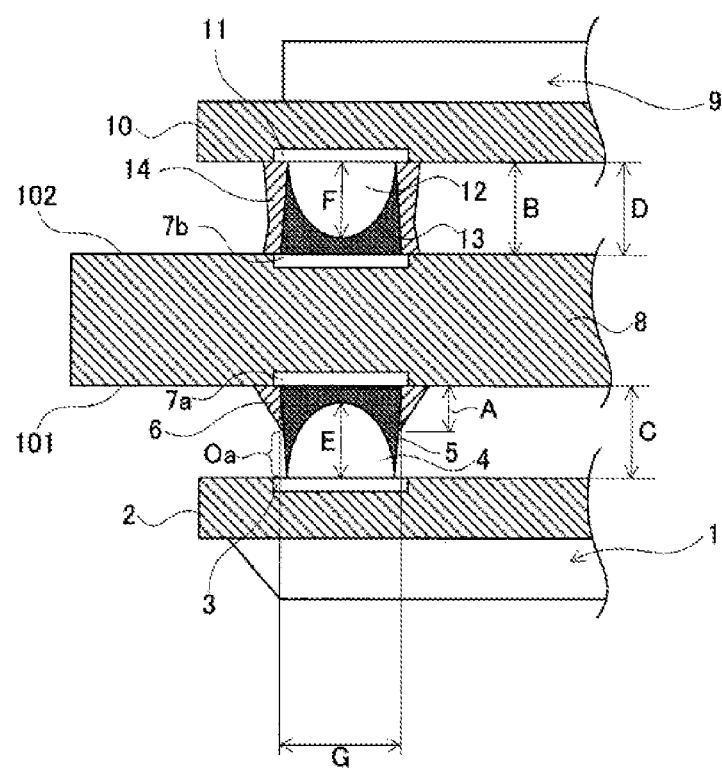
FIG. 3 is a sectional view of a mounting structure according to a first embodiment.

FIG. 3 shows a mounting structure according to the first embodiment.

With regard to the mounting structure, ingredients for a solder paste used herein, etc. are selected as appropriate. This makes it possible to produce a superior mounting structure by only carrying out the same steps as described in FIGS. 1A to 1D.

In addition, the same components, parts, etc. as in FIGS. 1A to 1D and FIGS. 2A and 2B, which show the related art example, will be described by donating the same symbols thereto.

The mounting structure is configured in the following manner: a semiconductor device 1, which serves as a first component to be mounted, is solder-mounted on a primary mounting surface 101 of a circuit substrate 8, which serves as a mounting component; and a semiconductor device 9, which serves as a second component to be mounted, is solder-mounted on a secondary mounting surface 102 of the circuit substrate 8.

A semispherical bump 4 is formed on an electrode 3, which has been formed in a substrate 2 of the semiconductor device 1. The bump 4 is joined to an electrode 7a, which is present on a primary mounting surface 101 of the circuit substrate 8, through a solder part 5. The solder part 5 corresponds to a solder ingredient that has been separated from the solder paste P, which is used in FIG. 1A, through reflowing of the solder paste P.

A semispherical bump 12 is formed on an electrode 11, which has been formed on a substrate 10 of the semiconductor device 9. The bump 12 is joined to an electrode 7b, which is present on a secondary mounting surface 102 of the circuit substrate 8, through a solder part 13. The solder part 13 corresponds to a solder ingredient that has been separated from the solder paste P, which is used in FIG. 1C, through reflowing of the solder paste P.

Sn—Ag—Cu solder is used for the bumps 4 and 12. Sn—Bi solder is used for the solder parts 5 and 13. The strength of the bumps 4 and 12 are higher than the strength of the solder parts 5 and 13.

The entire periphery of the solder part 13 between the secondary mounting surface 102 and the substrate 10 of the semiconductor device 9 is covered with a reinforcing resin 14. The height B of the reinforcing resin 14 is the same as a gap width between the circuit substrate 8 and the substrate 10. The entire periphery of the bump 12 and the solder part 13 is covered with the reinforcing resin 14, and is thus reinforced. The reinforcing resin 14 corresponds to a resin ingredient that has been separated from the solder paste P, which is used in FIG. 1C, through reflowing of the solder paste P. In this embodiment, the height B of the reinforcing resin 14 is larger than the height F of the bump 12. The top of the semispherical bump 12 is not in contact with an electrode 7b of the circuit substrate 8.

An area of the periphery of the solder part 5 between the primary mounting surface 101 of the circuit substrate 8 and the substrate 2 of the semiconductor device 1, the area extending from the primary mounting surface 101 to the height A, is covered with a reinforcing resin 6. The reinforcing resin 6 corresponds to a resin ingredient that has been separated from the solder paste P, which is used in FIG. 1A, through reflowing of the solder paste P. In this embodiment, the height A of the reinforcing resin 6 is smaller than the gap width C between the circuit substrate 8 and the substrate 2. Consequently, an exposed part Oa, which refers to an exposed portion of the solder part 5, is formed between the solder part 5 and the substrate 2. In addition, the height E of the bump 4 is smaller than the gap width C. consequently, a structure in which the top of the semispherical bump 4 is not in contact with an electrode 7a of the circuit substrate 6 is formed.

The base ends of the reinforcing resins 6 and 14 are in contact with the circuit substrate 8, and these parts each form fillets that are flared at the bottoms on the respective sides of the circuit substrate 8. A portion of the connection part between the bump 4 and the solder part 5 is covered with the reinforcing resin 6. Particularly, the reinforcing resin 6 covers a portion of the first solder part 5, and is not in contact with the first bump 4. More particularly, the tip of the reinforcing resin 6 is not in contact with the substrate 2 and the electrode 3 of the semiconductor device 1. Also, a portion of the connection part between the bump 12 and the solder part 13 is covered with the reinforcing resin 14. Particularly, the reinforcing resin 14 covers the entire portion of the second solder part 13, and the tip of the reinforcing resin 14 is in contact with the substrate 10 and the electrode 11 of the semiconductor device 9.

Accordingly, when the mounting structure is subject to thermal or mechanical shock, deformation of the circuit substrate 8 can be suppressed, and the impact resistance can be improved. However, since the area covered with the reinforcing resin 6 present at the primary mounting side is smaller than the area covered with the reinforcing resin 14 present at the secondary mounting side, there may be a tendency that effects of impact resistance are relatively less at the primary mounting side.

In addition, the reinforcing resins 6 and 14 almost evenly cover the bumps 4 and 12, respectively, along their whole circumferences. This is because solder paste P is melted, and the solder and the resin are separated from each other, and move. Depending on a position where the solder paste P is coated, there would be cases where the reinforcing resins do not cover the bumps 4 and 12, respectively, over their entire circumferences. It is not necessarily required that the reinforcing resins 6 and 14 entirely cover the peripheries of the bumps 4 and 12 along their entire circumferences, and it is sufficient for the reinforcing resins 6 and 14 to cover at least portions of the bumps 4 and 12.

Thus, by covering a portion of the solder part 5 with the reinforcing resin 6, the exposed part Oa, which is formed by causing a portion of the solder part 5 to expose, is formed. Accordingly, even when the solder part 5 is again melted through reflowing in the secondary mounting step, a space into which the molten and swollen solder part 5 expands can be secured, and therefore, the solder part 5 returns to the original shape when it is cooled after the secondary mounting step. As a result, any solder flush does not occur.

In addition, specific examples of mounting conditions and ingredients for solder pastes P used herein, specific examples of shapes and sizes of bumps 4 and 12, gap widths C between a circuit substrate 8 and a substrate 2, and gap widths D between the circuit substrate 8 and a substrate 10, etc. are described as Examples 1, 2 and 5 below.

(Second Embodiment)

Figure 4:
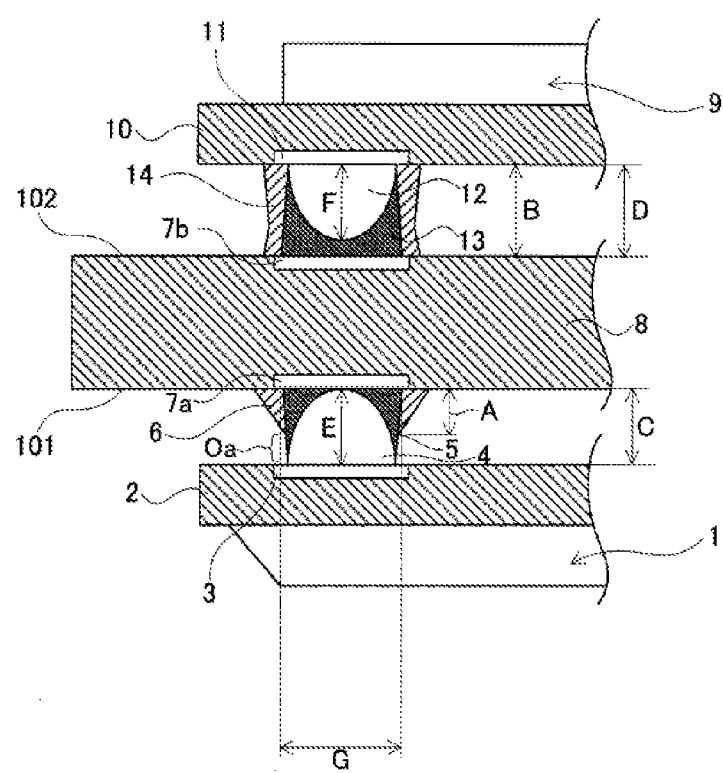
FIG. 4 is a sectional view of a mounting structure according to a second embodiment.

FIG. 4 shows a mounting structure according to the second embodiment.

In the first embodiment shown in FIG. 3, the top of the bump 4 on the semiconductor device 1 is not in direct contact with the electrode 7a on the primary mounting surface 101 of the circuit substrate 8. Also, the solidified solder part 5 intervenes between the top of the bump 4 and the electrode 7a. On the other hand, in the second embodiment, the top of the bump 4 of the semiconductor device 1 is in direct contact with an electrode 7a on the primary mounting surface 101 of a circuit substrate 8. Other structural features are the same as in the first embodiment.

That is, the entire surface of the connection part between the solder part 5 and the bump 4 is not covered with a reinforcing resin 6 in the same manner as the case in FIG. 3. An exposed part Oa, which refers to an exposed portion of the solder part 5, is formed therein. A difference between the first embodiment in FIG. 3 and the second embodiment is that the top of the bump 4 is in contact with the electrode 7a on the circuit substrate 8, and that the gap width C between the circuit substrate 8 and the substrate 2 is smaller.

Therefore, compared with the reinforcing resin 14 on the secondary mounting side, the area covered by the reinforcing resin 6 on the primary mounting side is smaller. However, the bump 4, which has strength superior to the strength of the solder part 5, reaches the electrode 7a on the circuit substrate 8. Accordingly, the impact resistance of this mounting structure is higher than the mounting structure according to the first embodiment 1 in FIG. 3.

In addition, specific examples of mounting conditions and ingredients of solder pastes P used herein, specific examples of shapes and sizes of bumps 4 and 12, gap widths C between a circuit substrate 6 and a substrate 2, and gap widths D between the substrate 8 and a substrate 10, etc. are described as Example 3 below.

(Third Embodiment)

Figure 5:
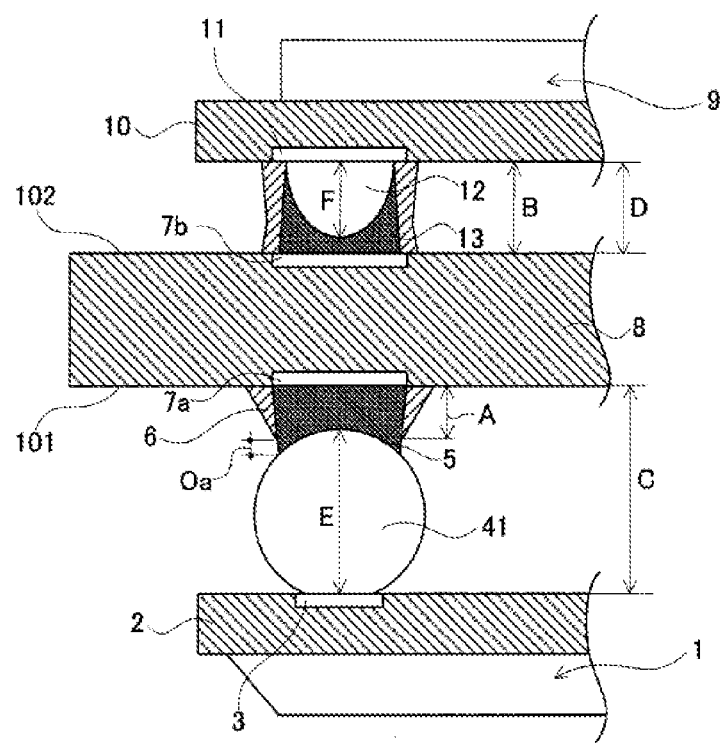
FIG. 5 is a sectional view of a mounting structure according to a third embodiment.

FIG. 5 shows a mounting structure according to the third embodiment.

In the mounting structure of the first embodiment shown in FIG. 3, the semispherical bump 4 is formed on the electrode 3 of the semiconductor device 1. However, the mounting structure in FIG. 5 differs from FIG. 3 only in that a spherical bump 41 is formed on the electrode 3 of the semiconductor device 1 in the mounting structure in FIG. 5. Other structural features are the same as the first embodiment. That is, the top of the reinforcing resin 6 is not in contact with the bump 41, and an exposed part Oa, which refers to an exposed portion of the solder part 5, is formed in the same manner as the case in FIG. 3. The composition of the bump 41 is the same as the composition of the bump 4.

Therefore, the gap width C between the circuit substrate 8 and the substrate 2 is significantly large, as compared with the gap in the case of FIG. 3. Accordingly, the strength of the mounting structure in this embodiment is lower than the first embodiment.

In addition, specific examples of mounting conditions and ingredients of solder pastes P used herein, specific examples of shapes and sizes of bumps 4 and 12, gap widths C between a circuit substrate 8 and a substrate 2, and gap widths D between the circuit substrate 8 and a substrate 10, etc. are described as Example 6 below.

(Fourth Embodiment)

Figure 6:
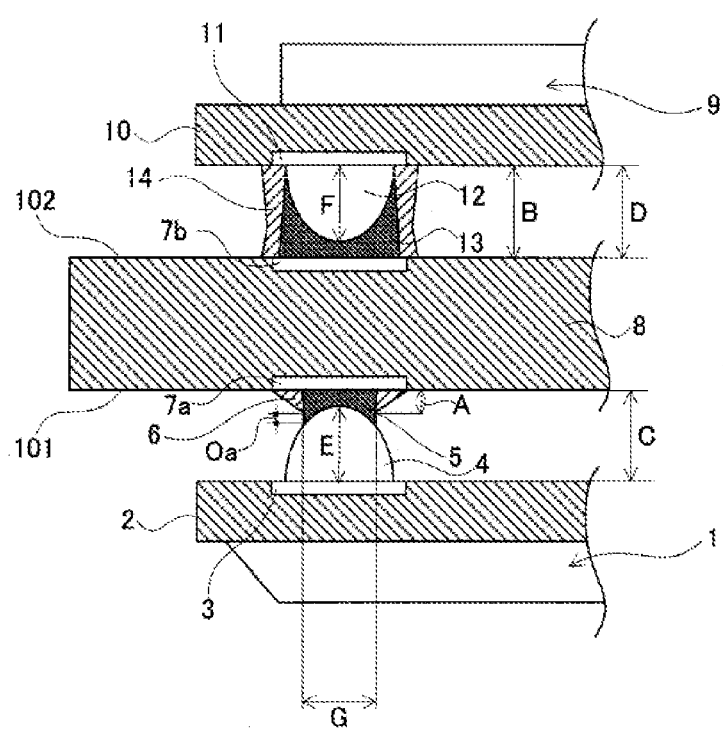
FIG. 6 is a sectional view of a mounting structure according to a fourth embodiment.

FIG. 6 shows a mounting structure according to the fourth embodiment.

A volume of a solder part 5 in the mounting structure in FIG. 6 is such smaller than the volume of the solder part 5 in the mounting structure shown in FIG. 3 according to the first embodiment. An expanding width G of the solder part 5 is smaller than the width of the solder part 5 in the mounting structure in FIG. 3. Other structural features are the same as the mounting structure according to the first embodiment, and the top of the reinforcing resin 6 is not in contact with the bump 4. An exposed part Oa, which refers to an exposed portion of the solder part 5, is formed in the same manner as the case of the mounting structure in FIG. 3. A mounting structure in which an area of the solder part 5, the area extending to the middle of the height E, is covered with a reinforcing resin 6 is preferable.

Accordingly, in the mounting structure according to the fourth embodiment, reinforcing effects by the reinforcing resin 6 are less, and the connection reliability may be inferior to the mounting structure in FIG. 3.

In addition, specific examples of mounting conditions and ingredients of solder pastes P used herein, specific examples of shapes and sizes of bumps 4 and 12, gap widths C between a circuit substrate 8 and a substrate 2, and gap widths D between the circuit substrate 8 and a substrate 10, etc. are described as Example 7 below.

(Fifth Embodiment)

Figure 7:
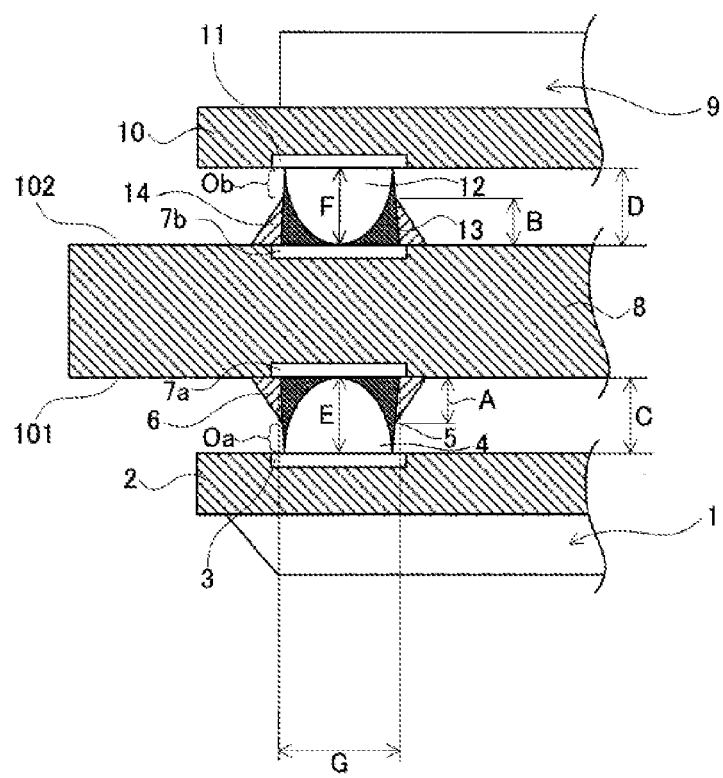
FIG. 7 is a sectional view of a mounting structure according to a fifth embodiment.

FIG. 7 snows a mounting structure according to the fifth embodiment.

In the mounting structure of the first embodiment shown in FIG. 3, the entire peripheral surface of the solder part 13 present between the circuit substrate 8 and the substrate 10 is covered with the reinforcing resin 14, only a portion of the solder part 5 present between the circuit substrate 8 and the substrate 2 is covered with the reinforcing resin 6, and the remaining portion of the solder part 5 is exposed as the exposed part Oa. However, in the mounting structure in FIG. 7, an exposed part Oa, which refers to an exposed portion of the solder part 5, is formed between the top of the reinforcing rein 6 and the substrate 2, and an exposed part Ob, which refers to an exposed portion of the solder part 13, is formed between the top of the reinforcing resin 14 and the substrate 10.

In other words, only a portion of the solder part 13 is covered with the reinforcing resin 14 with its base end in contact with the circuit substrate 8, and the top of the reinforcing resin 14 is not in contact with the bump 12. Furthermore, while the tops of the bumps 4 and 12 are not in direct contact with the electrodes 7a and 7b in FIG. 3, the tops of the bumps 4 and 12 are in direct contact with electrodes 7a and 7b in the mounting structure in FIG. 7. Other structural features are the same as those in the mounting structure according to the first embodiment.

Thus, in the mounting structure in this embodiment, the exposed part Oa is formed on the side of the primary mounting surface 101, and the exposed part Ob is also formed on the side of the secondary mounting surface 102. Therefore, the thickness is small on the whole.

Furthermore, the bumps 4 and 12, which have strength superior to the solder parts 5 and 13, reach the electrodes 7a and 7b, respectively, of the circuit substrate 8. Accordingly, the impact resistance is improved, and reductions in the areas of the reinforcing resins 6 and 14 are compensated, thereby maintaining excellent reliability.

In addition, specific examples of mounting conditions and ingredients of solder pastes P used herein, specific examples of shapes and sizes of bumps 4 and 12, gap widths C between a circuit substrate 8 and a substrate 2, and gap widths D between the circuit substrate 8 and a substrate 10, etc. are described as Example 4 below.

Contents of Examples 1-7, which are specific examples of the above-described embodiments, overall judgements, etc. are shown in Table 2. The conventional configuration shown in FIG. 2A was prepared as Comparative Example 1. For solder pastes P, 6 types of solder pastes P-1 to P-6 that included different ingredients shown in Table 1 were used.

TABLE 1

| Materials | Product Name | Solder pastes | | | | | |
|---|---|---|---|---|---|---|---|
| | | P-1 | P-2 | P-3 | P-4 | P-5 | P-6 |
| Epoxy resin | 806 (parts) | 13 | 8 | 7 | 12 | 5 | 7 |
| | 4004P (parts) | 0 | 0 | 0 | 0 | 2 | 2 |
| | YX4000 (parts) | 0 | 2 | 0 | 0 | 0 | 2 |
| Curing agent | 2P4MZ (parts) | 3 | 2 | 1 | 2 | 2 | 2 |
| Activating agent | Glutaric acid (parts) | 1 | 1 | 1 | 1 | 1 | 1 |
| Thixotropy-imparting agent | THIXCIN R (pats) | 1 | 2 | 1 | 2 | 3 | 1 |
| | RY200 (parts) | 0 | 0 | 0 | 1 | 0 | 0 |
| Solvent | Toluene/IPA (parts) | 0 | 0 | 1 | 1 | 0 | 0 |
| Solder | Sn58Bi (parts) | 82 | 85 | 90 | 82 | 87 | 85 |
| Liquid properties of solder pastes | Solder ratio [wt %] | 82 | 85 | 90 | 85 | 87 | 85 |
| | Thixotropy index | 2.3 | 4.1 | 3.5 | 5.0 | 4.6 | 3.0 |
| | Viscosity [Pa · s] | 210 | 330 | 390 | 250 | 410 | 450 |
| Degree of spread of resin [mm] | | 3.0 | 1.1 | 0.6 | 0.8 | 0.9 | 1.3 |
| Ratio of resin to solder | | 16% | 12% | 8% | 14% | 8% | 13% |

TABLE 2

| | | | Example 1 First embodiment | Example 2 First embodiment | Example 3 Second embodiment | Example 4 Fifth embodiment | Example 5 First embodiment | Example 6 Third embodiment | Example 7 Fourth embodiment | Comparative Example 1 Conventional example |
|---|---|---|---|---|---|---|---|---|---|---|
| | | Structure | FIG. 3 | FIG. 3 | FIG. 4 | FIG. 7 | FIG. 3 | FIG. 5 | FIG. 6 | FIG. 2 |
| Primary mounting surface | Structure | Bump height E [μm] | 100 | 100 | 100 | 100 | 100 | 190 | 100 | 100 |
| | | Gap width C [μm] | 130 | 120 | 100 | 100 | 130 | 230 | 120 | 130 |
| | | Resin height A [μm] | 60 | 50 | 50 | 40 | 60 | 60 | 30 | 130 |
| | | A/C | 46% | 42% | 50% | 40% | 46% | 26% | 25% | 100% |
| | | Solder pastes | P-2 | P-3 | P-4 | P-5 | P-6 | P-1 | P-1 | P-1 |
| Secondary mounting surface | Structure | Bump height F [μm] | 100 | 100 | 100 | 100 | 100 | 100 | 100 | 100 |
| | | Gap width D [μm] | 130 | 130 | 130 | 100 | 130 | 130 | 130 | 130 |
| | | Resin height B [μm] | 130 | 130 | 130 | 40 | 130 | 130 | 130 | 130 |
| | | B/D | 100% | 100% | 100% | 40% | 100% | 100% | 100% | 100% |
| | | Solder pastes | P-1 | P-1 | P-1 | P-5 | P-1 | P-1 | P-1 | P-1 |
| Structure | Total gap width C + D | | 260 μm | 250 μm | 230 μm | 200 μm | 260 μm | 360 μm | 240 μm | 260 μm |
| | Judgement result | | Good | Good | Good | Excellent | Good | Fair | Good | Good |
| Reliability | Drop resistance | | 90 times | 74 times | 112 times | 71 times | 98 times | 101 times | 25 times | 120 times |
| | Judgement result | | Good | Fair | Excellent | Fair | Good | Good | Fair | Excellent |
| | Presence or absence of solder flush | | Absent | Absent | Absent | Absent | Absent | Absent | Absent | Present |
| | Judgement result | | Good | Good | Good | Good | Good | Good | Good | Bad |
| Overall judgement | | | Excellent | Good | Excellent | Good | Excellent | Good | Good | Bad |

At first, specific configurations that were common to Comparative Example 1 and Examples 1 to 7 will be described.

<Semiconductor devices 1 and 9>

For semiconductor devices 1 and 9, which were components to be mounted, the same devices having a daisy chain circuit were used. The size thereof was 11 mm×11 mm×0.5 mm. Thicknesses of mounted substrates 2 and 10 were 0.2 mm.

In addition, the size of the circuit substrate 8 was 30 mm×70 mm×1.0 mm, electrodes 7a and 7b were made of copper, and the circuit substrate 8 was made of a glass epoxy material.

<Bumps 4 and 12>

For bumps 4 and 12, a Sn—Ag—Cu solder material that has an alloy composition that includes a combination of at least one element selected from the group consisting of Bi, In, Ag, Zn and Cu, and Sn, and that has a melting point higher than a melting point of Sn—Bi solder is preferable. The pitches of the bumps 4 and 12 were 0.4 mm, and the number of the bumps was 441. Sn3.0Ag0.5Cu solder, which is a cream solder material (melting point 219° C./product name "M705-GRN360-L60C" manufactured by SENJU METAL INDUSTRY CO., LTD.) was printed onto electrodes 7a and 7b of substrates 2 and 10 using a metal mask, and bumps 4 and 12 were formed with a heating furnace.

<Solders 5 and 13>

The solder ingredient, which is separated from a solder paste and then forms solders 5 and 13, is Sn—Bi solder. For example, a single tin-based alloy or a mixture of tin-based alloys can be used, and, particularly, an alloy composition selected from the group consisting of a Sn—Bi alloy, a Sn—In alloy, a Sn—Bi—In alloy, a Sn—Ag—Bi alloy, a Sn—Cu—Bi alloy, a Sn—Ag—Cu—Bi alloy, a Sn—Ag—In alloy, a Sn—Cu—In alloy, a Sn—Ag—Cu—In alloy, and a Sn—Ag—Cu—Bi—In alloy can be used.

<Reinforcing resins 6 and 14>

The resin ingredient, which is separated from a solder paste and which then forms the reinforcing resins 6 and 14, is a thermosetting resin, and can include various resins such as an epoxy resin, a urethane resin, an acrylic resin, a polyimide resin, a polyamide resin, bismaleimide resin, a phenolic resin, a polyester resin, a silicone resin, and an oxetane resin. These resins say be used singularly, or two or more resins may be combined. Among these resins, as described below, an epoxy resin is particularly preferable. For the epoxy resin, an epoxy resin that is liquid at room temperature may be used. For example, a bisphenol A epoxy resin, a bisphenol F epoxy resin, a bisphenol S epoxy resin, an alicyclic epoxy resin, etc. are suitable. Epoxy resins obtained by modifying these resins may also be used. These liquid epoxy resins may be used singularly, or two or more resins may be combined.

<Curing Agents>

For a curing agent that can be combined with the above-described thermosetting resins, a compound selected from the group consisting of a thiol compound, a modified-amine compound, a polyfunctional phenol compound, an imidazole compound, and an acid-anhydride compound can be used. These compounds can be used singularly, or two or more compounds can be combined. In addition, as needed, an organic acid or halogen compound can be added thereto as a reducing agent for removing an oxide film on surfaces of solder particles.

For the organic acid, an organic acid having one or more carboxyl groups may be used. However, low-molecular-weight compounds are effective for development of a reduction reaction at a low temperature, and compounds having multiple carboxyl groups are effective in cases where an intense reduction reaction is required. Examples of compounds having one carboxyl group include levulinic acid, phenylbutyric acid, abietic acid, and the like. Furthermore, examples of compounds having two carboxyl groups include various compounds such as succinic acid, malonic acid, gluraric acid, adipic acid, sebacic acid, pimelic acid, and citric acid.

<Control of Hardness of Reinforcing Resins 6 and 14>

Since a structure in which an exposed part Oa is formed on the primary mounting side is adopted, flush of the Sn—Bi solder part 5 on the primary mounting side can be prevented in the secondary mounting step. To form an effective structure thereof, it is very important to control expansion of the resin to be small in the primary mounting step. In other words, in general, the Sn—Bi solder part 5 is melted by heating, and diffuses into the Sn—Ag—Cu bump 4 in the molten state, during the primary mounting step. In that case, a resin that has not yet been cured follows the solder part 5, and levels to the solder part 5, thus forming a fillet structure. However, it is required that the resin steps to level in the middle of the expansion.

In other words, it is required to impart function of fluidity-controlling properties to the resin in the solder paste that has a low melting point and that includes Sn—Bi solder and a resin binder. For that reason, it was found that, as one means for suppressing fluidity of the epoxy resin during melting of the solder in order to adjust hardness of the reinforcing resins 6 and 14, high-viscosity epoxy resins are effective. In particular, it was revealed that an epoxy resin that has a softening point 70° C. to 110° C. and an epoxy equivalent of 250 to 1000 is effective. As such a high-viscosity epoxy resin, specifically, an epoxy resin selected from the group consisting of a polyfunctional epoxy resin, a brominated epoxy resin, a glycidyl ester-type epoxy resin, and a polymer-type epoxy resin is useful. For example, a high-molecular-weight bisphenol A epoxy resin, a high-molecular-weight bisphenol F epoxy resin, a high-molecular-weight biphenyl epoxy resin, a naphthalene epoxy resin, a phenol novolak epoxy resin, and a cresol novolak type epoxy resin can be preferably used. Epoxy resins obtained by modifying these epoxy resins can also be used. These epoxy resins can be used singularly, or two or more epoxy resins can be combined.

Furthermore, it was found that, as one embodiment, addition of a thixotropy-imparting agent is effective as a method for suppressing fluidity of the epoxy resin in the low-melting-temperature solder paste on the primary mounting surface, during melting of the solder.

For the thixotropy-imparting agent, an organic or inorganic thixotropy-imparting agent can be used. For the thixotropy-imparting agent, low-molecular-weight amides, polyesters, organic derivatives of castor oil, etc. are useful. Additionally, for the inorganic thixotropy-imparting agent, hydrophobized fumed silica with a primary particle diameter from 7 nm to 40 nm, etc. are useful. These may be combined, as appropriate, to suppress the spread of the epoxy resin during melting of the solder.

In addition, when an epoxy resin with a high melting point and a thixotropy-imparting agent are combined as a flux ingredient, the solder paste will be highly viscous, and thus, the printing workability will be inferior. Therefore, a solvent may be added thereto. As for types of usable solvents, any solvents that have sufficient solubility with epoxy resins and that do not generate voids when they are volatilized during the heat-curing process are preferable. However, solvents usable in the disclosure are not limited thereto. For example, isopropyl alcohol, isobutyl alcohol, toluene, n-hexane, methyl ethyl ketone, 1,2-butanediol, etc. can be mentioned.

The structures shown in FIGS. 3-7 and FIG. 2, which corresponds to the comparative example, have been realized by using differently the solder pastes P-1 to P-6 shown in Table 1.

<Solder Paste P-1>

The solder paste P-1 is a standard-type solder paste that includes a resin and that has a low melting temperature. This paste has a low viscosity and low thixotropy, and the degree of spread of the resin during melting of the solder is large. As a result, the resin spreads to the peripheries of the solders, and the reinforcing resins 6 and 14 cover the entire lateral surfaces of the solder parts and the bumps.

<Solder Paste P-2>

The solder paste P-2 has slightly higher thixotropy, and the degree of spread of the resin during the melting of the solder is relatively small, because the high-melting temperature epoxy resin is combined therein. Since the solder paste does not significantly spread, it does not cover the entire lateral surfaces of the solder parts and the bumps.

<Solder Paste P-3>

With regard to the solder paste P-3, the ratio of the solder is high, the solder paste has slightly high viscosity, and the degree of spread of the resin during melting of the solder is quite small. Since the solder paste does not significantly spread, it does not cover the entire lateral surfaces of the solder parts and the bumps.

<Solder Paste P-4>

With regard to the solder paste P-4, since the inorganic thixotropy-imparting agent is combined therein, the degree of spread of the resin during melting of the solder is small. Since the solder paste does not significantly spread, it does not cover the entire lateral surfaces of the solder parts and the bumps.

<Solder Paste P-5>

With regard to the solder paste P-5, since the high-melting-temperature epoxy resin is combined, and the amount of thixotropy-imparting agent is increased, the solder paste has high thixotropy/viscosity, and the degree of spread of the resin during melting of the solder is small. Since the solder paste does not significantly spread, it does not cover the entire lateral surfaces of the solder parts and the bumps.
<Solder Paste P-6>

With regard to the solder paste P-6, since the high-melting-temperature epoxy resin is combined, the solder paste has high viscosity, and the degree of spread of the resin during melting of the solder is relatively small. Since the solder paste does not significantly spread, it does not cover the entire lateral surfaces of the solder parts and the bumps.
<Thermosetting Resins>

Epoxy resins, which were thermosetting resins, were used. A bisphenol F epoxy resin (product name "806" manufactured by MITSUBISHI CHEMICAL HOLDINGS CORPORATION) was used as a low-viscosity epoxy resin, and a high-molecular-weight bisphenol F epoxy resin (product name: "4004P"; softening point: 85° C.; epoxy equivalent: 907; manufactured by MITSUBISHI CHEMICAL HOLDINGS CORPORATION) and a biphenyl epoxy resin (product name: "YX4000": melting point: 105° C.; epoxy equivalent: 186; manufactured by MITSUBISHI CHEMICAL HOLDINGS CORPORATION) were used as high-melting-point epoxy resins.
<Curing Agent>

For the curing agent, an imidazole curing agent (product name: "CUREZOL 2P4MZ" manufactured by SHIKOKU CHEMICALS CORPORATION) was used, and glutaric acid (WAKO PURE CHEMICAL INDUSTRIES, LTD.) was used as an activating agent.
<Thixotropy-Imparting Agent>

For the organic thixotropy-imparting agent, a castor oil-based thixotropy-imparting agent (product name "THIX-CINR" manufactured by ELEMENTIS JAPAN KK) was used. For the inorganic thixotropy-imparting agent, hydrophobized fumed silica (product name "RY200" manufactured by NIPPON AEROSIL CO., LTD.) was used.
<Solder Ingredient>

Sn—58Bi solder (diameter: 15-25 μm; manufactured by MITSUI MINING & SMELTING CO., LTD.) was used in common as a solder ingredient for the solder pastes P-1 to P-6.
<Method for Evaluating Solder Pastes P-1 to P-6>

Viscosities and thixotropy indexes for the respective pastes were measured with the E-type viscometer manufactured by TOKYO KEIKI INC. Measurement conditions are described below.
Viscosity Rotation speed: 5 rpm A viscosity value obtained 1 minute after the start of measurement.
Thixotropy Index A viscosity value obtained 2 minutes after the agitation at 0.5 rpm/a viscosity value obtained 1 minute after the agitation at 5 rpm (Degree of the resin expansion)

A resin-containing solder paste with a low melting point was coated onto a copper plate of 50 mm×50 mm×0.5 mm using a metal mask that has a thickness of 2.5 mm, and a pore with a dimeter of 6 mm, and the coated solder paste was melted by heating the plate with a hot plate at 160° C. Then, the expansion width of the epoxy resin, which spread out of the periphery of the solder part, was measured.
(Mounting Steps for Examples 1 to 7 and Comparative Example 1)

A semiconductor device 1 with a bump 4 was mounted onto an electrode 7a on a primary mounting surface 101 of a circuit substrate 8, in which the electrode 7a had been coated with any one selected from the solder pastes P-1 to P-6. Then, the solder paste was melted in a heating furnace 16, and the semiconductor device 1 is thus connected to the electrode 7a. Subsequently, the circuit substrate 8 was turned upside down.

Next, a semiconductor device 9 with a bump 12 was mounted on an electrode 7b on a secondary mounting surface 102 of a circuit substrate 8, in which the electrode 7b had been coated with any one selected from the solder pastes P-1 and P-5. Then, again, the solder paste was molted in a heating furnace 16, and thus, both-side mounting was completed.

The melting point of the bump 12 (SnAgCu ball) was 219° C., and the melting point of the solder paste (Sn58Bi solder paste) was 138° C. Required conditions were that a reflow heating temperature (reflow maximum ultimate temperature) of the Sn58Bi solder paste was equal to or higher than the melting point of the Sn58Bi solder, and was lower than the melting point of the solder bump, and the materials were heated to 155° C. in common through Examples 1 to 7 and Comparative Example 1, and thus, the process of mounting was carried out.

In the step for connection of the semiconductor device, the solder paste that had a mixture composition of a low-melting-point Sn-58Bi solder and a thermosetting resin and that had a low melting point was coated onto the circuit substrate 8, and the resulting material was reflow-heated to cause the Sn-58Bi solder to melt.

When the solder ingredient in the solder paste P-2 is melted, the molten solder goes to a state in which the surfaces of the Sn—Ag—Cu bump 4 and the electrode 3 are wetted with the molten solder (a metal-diffusion state). Due to formation of the metal-diffusion state, the solder ingredient forms an aggregation state in the solder paste, the thermosetting resin is protruded therefrom, and thus, the two ingredients are separated from each other. The separated thermosetting resin is disposed around the solder material. Then, the thermosetting resin is thermally cured, thus forming into the reinforcing resin 6, and, simultaneously, the molten solder ingredient is solidified, thus forming into the solder part 5. Thus, the bump 4 and the electrode 3 are electrically connected to each other. Additionally, the reinforcing resin 6 covers a connection part between the solder part 5 and the bump 4, and the solder part 5, thus reinforcing these parts.

EXAMPLE 1

As shown in Table 2, the solder paste P-2 was used with respect to the primary mounting surface 101, the solder paste P-1 was used with respect to the secondary mounting surface 102, thereby carrying out both-side mounting as described in FIG. 3. Consequently, a device for evaluation was produced.

The solder paste P-1 for the secondary mounting surface 102 is a standard-type resin-containing solder paste, and has low viscosity and thixotropy. As a result, expansion of the resin is large in melting of the solder. Accordingly, the secondary mounting surface 102 has a structure in which the reinforcing resin 14 covers the connection part between the solder part 13 and the bump 12, and the entire periphery of the solder part 13, and the reinforcing resin 14 extends from the circuit substrate 8 to the substrate 10 of the semiconductor device 9.

The solder paste P-2 for the primary mounting surface 101 has slightly high thixotropy, and the degree of spread of the resin during melting of the solder is relatively small, because the high-melting-point epoxy resin (YX4000) is combined therein. Therefore, even when the reinforcing resin 6 covers the connection part between the solder pat 5 and the bump 4, and the solder part 5, the reinforcing resin 6 does not extend from the circuit substrate 8 to the substrate 2 of the semiconductor device 1 because the fluidity of the resin is suppressed. Consequently, a structure in which a portion of the solder part 5 is almost evenly exposed at the exposed part Oa is formed.

In Example 1, the primary mounting side does not have a structure in which the reinforcing resin 6 covers the entire periphery of the solder part 5, and therefore, the molten solder part 5 expands and spreads to the exposed part Oa, which is a portion not covered with the resin. Accordingly, the internal pressure of the molten solder 5 is not increased, and, subsequently, the molten solder 5 moves back to the original position when it is cooled. Consequently, any defects due to solder flush are not generated.

Moreover, since the top of the bump 4 on the primary mounting surface 101 does not reach the circuit substrate 8 in the connection part, the gap width C is large. Consequently, the total gap that is a sum of the respective gaps in the primary and secondary mounting sides is 260 μm, and thus, is slightly large.

Furthermore, reliability of drop resistance of the both-side-mounted package, which had been subjected to primary and secondary mounting processes, was 90 times.

In addition, evaluations on mounting structures in Table 2 were carried out in the following ways.
(Presence or Absence of Flush Generation)

A mounting structure was prepared, and protrusion, of the solder from parts of solders 5 and 13 was visually observed with an X-ray irradiation device, and the presence or absence thereof was determined.
(Drop Resistance)

The mounting structure was dropped from a position 30 cm high with the primary mounting surface 101 facing downward. When the resistance value of a daisy chain circuit prepared in the semiconductor device 1 was increased to 20% or higher, the mounting structure was judged as inferior. The number of dropping treatments required for occurence of defects was measured, and, when the number was 50 or more, the drop resistance was evaluated as acceptable.
(Total Gap Width)

The total gap width shows a sum of the gap width C between the substrate 2 of the semiconductor device 1 on the primary mounting surface 101 and the circuit substrate 8, and the gap width D between the substrate 10 of the semiconductor device 9 on the secondary mounting surface 102 and the circuit substrate 8. When the total gap width was 200 μm or less, the mounting structure was evaluated as excellent; when the total gap width was from 200 μm to 300 μm, the mounting structure was evaluated as good; and, when the total gap width was 300 μor more, the mounting structure was evaluated as bad.
(Overall Judgement)

With regard to the overall judgement, when at least one "bad" was marked in the structure evaluation and the reliability evaluation, the product was judged as "bad"; when at least one "fair" was marked in the structure evaluation and the reliability evaluation, the product was judged as "good"; and when no "good" and "bad" were not present in the structure evaluation and the reliability evaluation, the product was judged as "excellent."

The method for evaluating a mounting structure was likewise applied to Examples 2 to 7 and Comparative Example 1 described below.

EXAMPLE 2

As shown in Table 2, the solder paste P-1 was used with respect to the secondary mounting surface 102, the solder paste P-3 was used with respect to the primary mounting surface 101, thereby carrying out both-side mounting, such that the structure in FIG. 3 was obtained. Thus, a device for evaluation was produced.

Since the ratio of the solder in the solder paste P-3 is 90 wt %, and thus is high, exhibiting high viscosity, the spread of the resin in the solder-melting process is quite small. In addition, 10 wt % of a solvent (toluene/isopropyl alcohol=1/1) was added to the total amount of the solder paste P-3 in order to adjust the viscosity.

As a result, since the reinforcing resin 6 on the primary mounting surface 101 does not provide a structure in which it covers the entire peripheries of the connection part between the bump 4 and the solder 5, and the solder 5, any increase in the internal pressure is not caused even during the heating treatment in the secondary mounting step, and no defects due to solder flush occur.

Moreover, since the top of the bump 4 on the semiconductor device 1 has the same structure as Example 1, the gap is large. Consequently, the total gap that is a sum of the respective gaps in the primary and secondary mounting sides is 250 μm, and thus, is slightly large.

Furthermore, reliability of drop resistance of the both-side-mounted package, which had been subjected to primary and secondary mounting processes, was 74 times. This is because it is considered that the solder ratio of the solder paste P-3 used in the primary mounting step is 90 wt %, and is thus high, the resin content is small, i.e. 10 wt %, and therefore, the reinforcing effects of the resin was reduced.

EXAMPLE 3

In the same manner as Examples 1 and 2, the solder paste P-4 was used with respect to the primary mounting surface 101, thereby carrying out the both-side mounting process, so that the structure in FIG. 4 was obtained. Thus, a device for evaluation was prepared. An inorganic thixotropy-imparting agent (hydrophobized fumed silica) was used in the solder paste P-4, and the spread, of the resin during the solder-melting process is small. In particular, since the inorganic thixotropy-imparting agent is not dissolved even at the melting temperature of the solder, fluidity of the epoxy resin can reliably be suppressed. As a result, the exposed part Oa was provided at the primary mounting side, any increase in the internal pressure was not caused during heating in the secondary mounting step, and therefore, no solder flush defects occurred.

Moreover, the top of the bump 4 on the semiconductor device 1 reached the circuit substrate 8. Consequently, the total gap, which is a sum of the respective gaps in the primary and secondary mounting sides is 230 μm, and thus, is slightly small.

Furthermore, reliability of drop resistance of the both-side-mounted package, which had been subjected to primary and secondary mounting processes, was 112 times, and thus, was high. This is because it is presumed that the top of the bump 4 with high strength reached the circuit substrate 8, and this made the product structurally rigid.

EXAMPLE 4

The solder paste P-5 was used with respect to the primary mounting surface 101 and the secondary mounting surface 102, thereby carrying out the both-side mounting process, so that the structure in FIG. 7 was obtained. Thus, a device for evaluation was prepared. Since a high-melting-temperature epoxy resin (4004P) was combined and the amount of an organic thixotropy-imparting agent was increased in the solder paste P-5, the solder paste P-5 had high thixotropy/viscosity, and the degree of spread of the resin during melting of the solder is small. As a result, the exposed parts Oa and Ob were provided with regard to the reinforcing resins 6 and 14, any increase in the internal pressure was not caused during heating in the secondary mounting step, and therefore, no defects due to solder flush occurred, in the same manner as the other examples.

Moreover, on both of the sides, the tops of the bumps 4 and 12 on the semiconductor devices 1 and 9 reached the circuit substrate 8. Consequently, the total gap, which is a sum of the respective gaps in the primary mounting surface 101 and secondary mounting surface 102, is 200 μm, and thus, is small.

Furthermore, reliability of drop resistance of the both-side-mounted package, which had been subjected to primary and secondary mounting processes, was 71 times. With regard to the reason for the result, it is presumed as follows. That is, the top of the bumps 4 and 12 with high strength reached the circuit substrate 8, and this made the product structurally rigid. However, since a structure in which the reinforcing resin 14 covers the entire periphery of the solder part on the secondary mounting surface 102 was not present, the strength was slightly weak.

EXAMPLE 5

In the same manner as Examples 1 to 3, the solder paste P-1 was used with respect to the secondary mounting surface 102, and the solder paste P-6 was used with respect to the primary mounting surface 101, thereby carrying out the both-side mounting process, so that the structure in FIG. 3 was obtained. Thus, a device for evaluation was prepared. Since high-melting-temperature epoxy resins (YX4000 and 4004P) were combined in the solder paste P-6, the solder paste P-6 had high viscosity, and the degree of spread of the resin during melting of the solder was relatively small.

Since the high-melting-temperature epoxy resins were combined, the resin viscosity at the melting temperature of the solder was high, and fluidity of the epoxy resin could be suppressed. In the same manner as the other examples, since the exposed part Oa was provided on the primary mounting side, any increase in the internal pressure was not caused during heating in the secondary mounting step, and therefore, no solder flush defects occurred.

Moreover, since the top of the bump 4 on the semiconductor device 1 did not reached the circuit substrate 8 in the connection part, the gap width C was large. Consequently, the total gap, which is a sum of the respective gaps in the primary and secondary mounting sides was 260 μm, and thus, was slightly large.

Furthermore, reliability of drop resistance of the both-side-mounted package, which had been subjected to primary and secondary mounting processes, was 98 times. It was presumed that, as compared with Example 1, the epoxy resins with high melting temperatures were combined in this example, the resin strength increased, and reliability of the drop resistance was increased.

EXAMPLE 6

The solder paste P-1 was used for both of the primary and secondary mounting steps, thereby carrying out the both-side mounting process, so that the structure in FIG. 5 was obtained. Thus, a device for evaluation was prepared. Since the ordinal spherical bump 41 was used for the primary mounting step, the reinforcing part of the epoxy resin was small. Therefore, although no defects due to solder flush occurred during heating in the secondary mounting step, the total gap, which is a sum of the respective gaps in the primary and secondary mounting sides was 360 μm, and thus, was quite large. Consequently, this goes against the trend toward slim-size mounting. In addition, the reliability of drop resistance was 101 times.

EXAMPLE 7

The solder paste P-1 was used on both of the primary and secondary mounting sides, thereby carrying out the both-side mounting process, so that the structure in FIG. 6 was obtained. Thus, a device for evaluation was prepared. Since the amount of the solder paste P-1 per connection part in the primary mounting surface 101 was smaller than the amount of the solder paste P-1 per connection part in the secondary mounting surface 102, the thickness of a printing mask, which was used when the solder paste was coated onto the primary mounting surface 101, was smaller than the thickness of a printing mask, which was used when the solder paste was coated onto the secondary mounting surface 102, and the diameter of the opening of the former was also smaller than the diameter of the opening of the latter.

Since the amount of the solder paste P-1 used on the primary mounting surface 101 is small, the entire periphery of the bump 4 was not covered with the resin, the amount of the solder part 5 was small, and also, the amount of the reinforcing resin 6 was small, although defects due to solder flush, which refer to protrusion of the Sn—Bi solder, did not occur. It was presumed that these resulted in reduced connection strength, and the reliability of the drop resistance exhibited a very low value, i.e. 25 times. However, the total gap, which is a sum of the respective gaps in the primary and secondary mounting sides was 240 μm, and thus, was slightly small.

COMPARATIVE EXAMPLE 1

As shown in Table 2, the solder paste P-1 was used on both of the primary and secondary mounting sides, thereby carrying out the both-side mounting process, so that the structure in FIG. 2 was obtained. Thus, a device for evaluation was prepared.

Since, on both of the primary and secondary mounting sides, the reinforcing resins 6 and 14, which were epoxy resins, cover the entire peripheries of the solder parts 5 and 13, defects due to solder flash, which refer to protrusion of the Sn—Bi solder, which was again melted as mentioned above, occurred.

Furthermore, the total gap, which is a sum of the respective gaps in the primary and secondary mounting sides was 260 μm, and thus, was equal to Example 1. In addition, reliability of drop resistance of the both-side-mounted package, which had been subjected to primary and secondary mounting processes, was 120 times, and thus, exhibited a high value, since the reinforcing resins 6 and 14 cover the entire surfaces of the respective connection parts on the both surfaces.

<Comparison between Examples 1 to 7 and Comparative Example 1>

With regard to the first mounting surface 101, the resins in the solder pastes P-2 to P-6, which were used for Examples 1 to 6, were designed so that fluidity of the reinforcing resin during melting of the solder with a low melting point could be suppressed. For that reason, even when the solder with a low melting point is melted, and a structure in which the reinforcing resin covers the connection part between the solder part with a low melting point and the bump, and the solder, thus, reinforcing these parts, is formed, the reinforcing resin does not reach the electrode on the semiconductor device because the fluidity was suppressed. In other words, when the reinforcing height A of the reinforcing resin is compared with the gap width C between the substrate 2 of the semiconductor device 1 and the circuit substrate 8, there is a relationship in which A<C.

On the other hand, with regard to the secondary mounting surface 102, the resin in the solder paste P-1 was designed so that fluidity of the reinforcing resin during melting of the solder with a low melting point was high, which means the reinforcing resin easily flowed. For that reason, a structure in which the reinforcing resin covers the connection part between the solder 5 and the bump 4, and the entire periphery of the solder 5, thus, reinforcing these parts, and the reinforcing resin reached the substrate 10 provided on the semiconductor device 9 was formed. In other words, a relationship between the height B of the reinforcing resin 14 on the secondary mounting surface 102 and the gap width D between the substrate 10 of the semiconductor device 9 and the secondary mounting surface 102 of the circuit substrate 8 was B≤D.

Examples 1 to 7 and Comparative Example 1 are compared.

In Examples 1 to 7, mounting structures in which the semiconductor devices 1 and 9 were electrically connected to the both surfaces of the circuit substrate 8 through the bumps 4 and 12 and the solder parts 5 and 13, and the peripheries of the solder parts were covered with the reinforcing resins 6 and 14 were produced. In these mounting structures, the reinforcing resin 6 on the primary mounting surface 101 did not cover the entire surface of the solder part 5, and a portion of the solder part 5 was almost equally exposed over its whole circumference as the exposed part Oa. Accordingly, occurrence of solder flush could be prevented on the side of the primary mounting surface 101 during secondary mounting. Furthermore, mounting structures that achieved slim-size mounting and that had excellent drop resistance could be prepared.

In the mounting structure of Example 1, which corresponds to FIG. 3, the bump 4 is completely covered by the solder part 5. On the other hand, in the mounting structure of Example 7, which corresponds to FIG. 6, only a portion of the bump 51 is covered with the solder part 5. Due to this difference, the drop resistance in Example 7 was inferior to the drop resistance in Example 1. Therefore, it is preferable that the bump 4 is entirely covered with the solder part 5.

<Resin Height A>

From Table 2, it was revealed that cases in which the resin height A is 25% to 50% of the gap width C are advantageous. When the resin height A is 100% of the gap width C, the solder part 5 is concealed, and therefore, such a case is not preferred. When the height A is 25% or less of the gap width C, reinforcement by the resin is not realized anymore.

<Resin Width>

Among the solder paste P series, the solder pastes P-3 and P-5 had low concentrations of the resins. Examples that used these solder pastes are Examples 2 and 4. As compared with the other example, these examples exhibited inferior drop resistance. Based on Table 1, the proportion of the resin to the solder needs to be at least 8 wt % or more.

The sizes of the bumps for the electrodes 11, 7a and 7b were 50 μm to 100 μm, and there were no influences on the above numbers.

In addition, the above embodiments can be combined.

Additionally, the semiconductor devices 1 and 9, which serve as components to be mounted, are described as representative examples of cases where they are BGA semiconductor devices formed from BGA-type semiconductors. However, the disclosure is not limited thereto. The disclosure can be applied to not only mounting of semiconductor devices but also mounting of semiconductor devices not to be packaged and other electronic components. The disclosure can be applied to not only cases in which only one semiconductor device is mounted on each side of the circuit substrate 8 but also to cases in which multiple semiconductor devices are mounted to each side of the circuit substrate 8. The disclosure can be applied to semiconductors or other electronic components as long as these components have solder bumps. Furthermore, although, as an example of a mounting component, the circuit substrate 8 is mentioned in the description, multilayer wiring substrates or semiconductor integrated circuits that internally include semiconductors and circuit components, etc. can be used as mounting components.

The disclosure can be utilized for a broad range of purpose in the fields of electric/electronic circuit-forming technologies. For example, the disclosure can be applied to a purpose of connecting electronic components such as CCD devices, hologram devices, and chips, and a purpose of joining such components to a mounting components, and can be utilized for products in which such devices, components or substrates are installed, e.g. mobile devices, portable phones, portable audio-video equipment, digital cameras and the like.

What is claimed is:

1. A mounting structure, comprising:
   a first component that has plural first semispherical bumps;
   a second component that has plural second semispherical bumps;
   a mounting component that has a primary mounting surface, on which the first component is mounted, and a secondary mounting surface, on which the second component is mounted;
   plural first solders that are respectively located between flat plate like plural first electrodes on the primary mounting surface of the mounting component and the plural first semispherical bumps;
   plural second solders that are respectively located between a flat plate like plural second electrodes on the secondary mounting surface of the mounting component and the plural second semispherical bumps;
   plural second reinforcing resins that respectively cover entire lateral surfaces of the second semispherical bumps and the second solders; and
   plural first reinforcing resins, wherein a base end of the plural first reinforcing resins is physically connected to the primary mounting surface of the mounting component, and a top end of the plural first reinforcing resins is not respectively in contact with the plural first semispherical bumps, wherein a portion of the plural first solders are respectively exposed as an exposed part that is formed between the top of the plural first reinforcing resins and a substrate of the plural first components, and the plural first electrodes and the plural second electrodes are different electrodes, the plural second reinforcing resins are physically in non-contact with each other, the plural first reinforcing resins are physically in non-contact with each other, the plural second reinforcing resins and the plural first reinforcing resins are physically in non-contact with each other.

2. The mounting structure according to claim 1, wherein the plural first semispherical bumps are respectively joined to the plural first electrodes on the primary mounting surface through the plural first solders, the plural second semispherical bumps are respectively joined to the plural second electrodes on the secondary mounting surface through the plural second solders, and tops of the plural first and plural second semispherical bumps are not respectively in direct contact with the plural first electrodes on the primary mounting surface of the mounting component, and the plural second electrodes on the secondary mounting surface of the mounting component, respectively.

3. The mounting structure according to claim 1, wherein top of each of the plural first semispherical bumps is in direct contact with a respective one of the plural first electrodes on the primary mounting surface of the mounting component, and each of the plural first semispherical bumps and the plural first electrodes are joined to each other through the plural first solders.

4. The mounting structure according to claim 1, wherein the plural first semispherical bumps are respectively joined to plural third electrodes on the surface of the plural first component, the plural second semispherical bumps are joined to plural fourth electrodes on the surface of the second component.

5. The mounting structure according to claim 1, wherein the plural second reinforcing resins respectively cover the side surfaces of the plural second semispherical bumps and the plural second solders with substantially the same film thickness.

6. The mounting structure according to claim 1, wherein the first component and the second component have the same size.

* * * * *